(12) United States Patent
Dean et al.

(10) Patent No.: US 7,186,976 B2
(45) Date of Patent: Mar. 6, 2007

(54) SCANNING ELECTRON MICROSCOPE

(75) Inventors: Michael Frank Dean, Waterbeach (GB); Giles Adam Edward Martin, Newmarket (GB)

(73) Assignee: Carl Zeiss SMT Limited, Cambridge (GB)

( * ) Notice: Subject to any disclaimer, the term of this patent is extended or adjusted under 35 U.S.C. 154(b) by 0 days.

(21) Appl. No.: 10/475,288

(22) PCT Filed: Apr. 19, 2002

(86) PCT No.: PCT/GB02/01901

§ 371 (c)(1),
(2), (4) Date: Apr. 26, 2004

(87) PCT Pub. No.: WO02/086942

PCT Pub. Date: Oct. 31, 2002

(65) Prior Publication Data

US 2004/0173747 A1 Sep. 9, 2004

(30) Foreign Application Priority Data

Apr. 20, 2001 (GB) ................................. 0109704.7

(51) Int. Cl.
*H01J 37/28* (2006.01)
*H01J 37/252* (2006.01)

(52) U.S. Cl. ................ 250/310; 250/311; 250/396 ML

(58) Field of Classification Search ........ 250/305–307, 250/310, 311, 396 E, 397, 399, 492.22, 492.3
See application file for complete search history.

(56) References Cited

U.S. PATENT DOCUMENTS

| | | | | |
|---|---|---|---|---|
| 4,550,258 A | * | 10/1985 | Omata et al. ............ | 250/505.1 |
| 4,720,633 A | * | 1/1988 | Nelson ........................ | 250/310 |
| 4,823,006 A | * | 4/1989 | Danilatos et al. ........... | 250/310 |
| 5,225,676 A | * | 7/1993 | Matsuya ..................... | 250/311 |
| 5,250,808 A | * | 10/1993 | Danilatos et al. ........... | 250/310 |
| 5,828,064 A | | 10/1998 | Knowles | |
| 5,900,629 A | * | 5/1999 | Todokoro et al. .......... | 250/310 |
| 5,981,947 A | * | 11/1999 | Nakasuji et al. ............ | 250/310 |

(Continued)

*Primary Examiner*—Nikita Wells
*Assistant Examiner*—Bernard Souw
(74) *Attorney, Agent, or Firm*—Barnes & Thornburg LLP

(57) ABSTRACT

There is provided a reconfigurable scanning electron microscope (RSEM) (100) comprising: (a) a gun assembly (110) and an associated electron optical column (120) for generating an electron beam (600), for demagnifying the electron beam (600) to generate an electron probe ($C_3$) and for scanning the probe ($C_3$) across a sample (190); (b) an electron detector (550) for detecting emissions from the sample (190) in response to scanned electron probe irradiation thereof and for generating a corresponding detected signal ($S_d$) indicative of the magnitude of the emissions; and (c) a display (170) for receiving the detected signal ($S_d$) and scanning signals (x, y) indicative of the position of the probe ($C_3$) relative to the sample (190) for generating the image of the sample (190). The RSEM (100) is distinguished in that it further includes aperture bearing members (500, 520), each member (500, 520) including an associated electonbeam transmissive aperture, for at least partially gaseously isolating the gun assembly (110) and the electron optical column (110) from the sample (190), thereby enabling the RSEM (100) to be reconfigurable as a high-vacuum scanning electron microscope and also as an environmental scanning electron microscope, the RSEM (100) being reconfigurable to include no aperture members, one aperture member (500, 750) and a plurality of aperture members (500, 750; 520 850, 860).

39 Claims, 6 Drawing Sheets

U.S. PATENT DOCUMENTS

| | | | |
|---|---|---|---|
| 6,043,489 A * | 3/2000 | Tongbhoyai et al. | 250/308 |
| 6,555,815 B2 * | 4/2003 | Feuerbaum et al. | 250/310 |
| 6,559,458 B2 * | 5/2003 | Rinn | 250/491.1 |
| 6,590,210 B1 * | 7/2003 | Essers | 250/310 |
| 6,674,075 B2 * | 1/2004 | Petrov et al. | 250/310 |
| 6,707,041 B2 * | 3/2004 | Essers | 250/310 |
| 6,764,796 B2 * | 7/2004 | Fries | 430/22 |
| 6,809,322 B2 * | 10/2004 | Danilatos | 250/441.11 |
| 2001/0008272 A1 * | 7/2001 | Rinn | 250/491.1 |
| 2002/0053638 A1 * | 5/2002 | Winkler et al. | 250/306 |
| 2003/0010913 A1 * | 1/2003 | Essers | 250/310 |
| 2003/0127594 A1 * | 7/2003 | Schneiker et al. | 250/311 |
| 2003/0168595 A1 * | 9/2003 | Danilatos | 250/310 |
| 2004/0079892 A1 * | 4/2004 | Schneiker et al. | 250/423 F |
| 2004/0173747 A1 * | 9/2004 | Dean et al. | 250/310 |
| 2006/0134810 A1 * | 6/2006 | Bullock | 438/5 |

* cited by examiner

SCANNING ELECTRON MICROSCOPE

TECHNICAL FIELD OF THE INVENTION

The present invention relates to scanning electron microscopes (SEMs). In particular, but not exclusively, the invention relates to scanning electron microscopes capable of operating as environmental scanning electron microscopes (ESEMs) and also as conventional high-vacuum SEMs.

BACKGROUND TO THE INVENTION

ESEMs are distinguished from high-vacuum SEMs in that they are capable of viewing samples maintained at pressures greater than in the order of 100 Pa.

It is known from U.S. Pat. No. 5,250,808 to adapt a conventional scanning electron microscope (SEM) to scan samples maintained at an elevated pressure, for example at an atmospheric pressure of substantially 1000 mBar, 760 Torr, 101.3 kPa. Such an adapted SEM comprises an electron gun for generating an electron beam, one or more electromagnetic lenses with associated electron beam deflectors for demagnifying and scanning the electron beam, a sample chamber for housing a sample to be viewed by scanning the demagnified electron beam thereover, a vacuum pumping system for evacuating the apparatus to generate a vacuum therein, one or more electron sensing assemblies for detecting secondary and backscattered electrons emitted from the sample in response to bombardment thereof by the scanned demagnified electron beam, and an electronic control system for controlling the SEM, the control system including one or more image displays. The adapted SEM additionally comprises in the electromagnetic lens nearest the chamber, namely the objective lens, a series of differentially pumped diaphragms. Each diaphragm includes therein an aperture through which the electron beam can pass. The diaphragms are designed to be installed permanently into the adapted SEM. The diaphragms define at least two interior passages which are in communication with vacuum pumping ports of the SEM. Above all, the adapted SEM is not designed to function with its series of differentially pumped diaphragms removed.

Inclusion of the diaphragms and maintaining the sample at elevated pressure introduces problems into operation of the adapted SEM.

Such problems result, for example, from electron scattering in higher-pressure regions surrounding the sample resulting in electron probe blurring. Moreover, inclusion of differentially pumped diaphragms imposes limitations of longer objective lens working distances and hence increased electron probe spherical aberration. Furthermore, in extreme cases, differentially pumped diaphragms can be an electron beam semiangle-limiting actor which can render microscope optical alignment problematic and reduce available electron probe current.

SUMMARY OF THE INVENTION

According to the invention, there is provided a reconfigurable scanning electron microscope comprising:
(a) electron optical means for generating an electron beam, for demagnifying the electron beam to generate an electron probe and for scanning the probe across a sample;
(b) detecting means for detecting emissions from the sample in response to scanned electron probe irradiation thereof and for generating a corresponding detected signal indicative of the magnitude of the emissions;

characterised in that the microscope former includes aperture means for at least partially gaseously isolating the electron optical means from the sample, thereby enabling the microscope to be reconfigurable as a high-vacuum scanning electron microscope and as an environmental scanning electron microscope, the aperture means reconfigurable to include no apertures, one aperture and a plurality of apertures.

The reconfigurable microscope provides the advantage that it is capable of being configurable in degrees between functioning as a high-vacuum SEM and an ESEM.

Thus, the inventors have appreciated that it is beneficial to design the scanning electron microscope so that it is selectively reconfigurable in degrees between functioning as an ESEM and also as a more conventional SEM operating at high vacuum in the order of $10^{-6}$ Torr or better.

The aperture means preferably comprises a carrier member retained in an objective lens of the electron optical means, the carrier member including features for reconfigurably accommodating one or more aperture bearing members therein. The carrier member is capable of providing a convenient and robust means for accommodating one or more aperture members when reconfiguring the microscope, thereby rendering the microscope robust and durable in use.

It is preferable to drop pressure in stages when operating the microscope as an ESEM. Thus, an intermediate pressure cavity is preferably included between the electron optical means and a chamber accommodating the sample, the chamber being in gaseous communication via the carrier member to the electron optical means.

Space around the base of the objective lens is relatively restricted, hence spatially efficient design of the intermediate cavity is advantageous. Thus, the objective lens preferably includes a lower plate for defining the intermediate cavity between a lower pole piece of the objective lens and the lower plate.

Conveniently, in order to avoid a need to handle minute diaphragms including apertures, aperture bearing members are employed which are conveniently sized to handle by hand. Thus, the microscope preferably comprises first and second aperture bearing members, the first member including a first aperture serving to substantially gaseously isolate the electron optical means from the intermediate pressure caviar and the second member including a second aperture serving to substantially gaseously isolate the chamber from the intermediate pressure cavity.

In order to reduce pressure from the sample to the electron optical means progressively, the microscope preferably includes vacuum pumping means for differentially evacuating the electron optical means, the intermediate pressure cavity and the chamber.

It is advantageous to avoid distorting an electron beam focusing magnetic field of the objective lens when installing the aperture bearing members. Therefore, the carrier member and the aperture members are preferably fabricated from substantially non-ferromagnetic materials.

The carrier member is preferably fabricated from a material dissimilar to that of the aperture members to avoid potential occurrence of vacuum welding therebetween. More preferably, the carrier member is fabricated from beryllium copper alloy and the aperture members are fabricated from phosphor bronze alloy.

In order to enable the microscope to be reconfigured frequently, it is preferable that the aperture members are reliably retained within the carrier member after many reconfigurations. Hence, the aperture members are preferably removably retained within the carrier member by means of co-operating screw threads.

Moreover, accurate concentric alignment of the aperture members is desirable to avoid aberrations when forming the probe. Thus, the aperture members preferably include frusto-conical surfaces for registering to corresponding frusto-conical co-operating surfaces of the carrier member, thereby ensuring accurate spatial alignment of the aperture members to the objective lens.

Preferably, the frusto-conical surface of the first aperture member subtends an angle in a range of 10° to 15° relative to a central longitudinal axis of the first member. More preferably, the frusto-conical surface of the first aperture subtends an angle of substantially 12° relative to the central axis of the first member.

Likewise, the frusto-conical surface of the second aperture member preferably subtends an angle in a range of 15° to 30° relative to a central longitudinal axis of the second member. More preferably, the frusto-conical surface of the second aperture member subtends an angle of substantially 20° relative to the central longitudinal axis of the second member.

The inventors have appreciated that selecting suitable aperture sizes for operating the microscope as an ESEM is not straightforward. Preferably, as a compromise between gas flow resistance and transmission of the electron beam, the first member includes a first electron beam transmissive aperture having a diameter in a range of 100 μm to 400 μm. More preferably, the first aperture has a diameter of substantially 200 μm. Likewise, the first aperture may to advantage have a depth in a range of 0.5 mm to 1.5 mm. More preferably, the first aperture has a depth of substantially 1 mm. Depths of more than 1.5 mm become difficult to machine whereas depths of less than 0.5 mm provide inadequate gas flow resistance.

Similarly, the second aperture member preferably includes a second electron beam transmissive aperture having a diameter in a range of 200 μm to 800 μm. More preferably, the second aperture has a diameter of substantially 500 μm. Conveniently, the diaphragm including the second aperture is retained in position in the second aperture member by means of a circlip. Moreover, the diaphragm including the second aperture is preferably fabricated from at least one of platinum and molybdenum. Platinum and molybdenum are mechanically stable materials which are compatible with high-vacuum apparatus.

The second aperture member preferably includes a plurality of radial holes for gaseously communicating an inside region of the second member with the intermediate pressure cavity. Such an arrangement facilitates the adequate evacuation of gas from the intermediate pressure cavity and the inside region of the second member.

The plurality of holes are preferably angularly equispaced. More preferably, the plurality of holes comprises eight holes as a compromise between evacuation efficiency and mechanical strength of the second member. Each of the plurality of holes preferably has a diameter in a range of 0.8 mm to 1.1 mm. More preferably, each of the plurality of holes has a diameter of substantially 1 mm.

The carrier member and the aperture members are preferably, in use, held in the objective lens. Moreover, inclusion of the carrier and aperture members in the objective lens should preferably not degrade the performance of the objective lens. Of critical importance to the probe forming performance of the objective lens is the quality of a lower bore of the its magnetic circuit. During manufacture this bore is carefully honed and lapped to a polished finish and machined to within microns of perfect circularity. Thus, the inventors have appreciated that, in order not to compromise the performance of the objective lens, the carrier is preferably retained in the objective lens by means of cold fitting.

Moreover, ease of installing and removing the aperture members from the carrier is a practical consideration to render the microscope convenient to use. Hence, the first aperture member preferably includes a slot feature for engaging with a tool when installing or removing the first member from the carrier member. Likewise, the second aperture member preferably comprises a plurality of flats on its exterior surface for engaging with a tool when installing or removing the second member from the carrier member.

In order not to significantly disturb the magnetic circuit of the objective lens, it is desirable that the lower plate defining the intermediate pressure cavity should be of a non-ferrous material. Thus, the lower plate is conveniently fabricated from at least one of aluminium and duraloy. Both these materials are non-ferromagnetic. Duraloy is an alloy of aluminium and copper.

In the microscope, backscattered and secondary electron emission from the sample in response to electron probe bombardment yield different information regarding the nature of the sample. Hence, the microscope preferably includes more than one type of detector for detecting the emitted electrons. More preferably, the detecting means comprises at least one of an electron sensitive photodiode, a microchannel plate, a scintillator-photomultiplier tube combination and an electrically isolated conductor plate.

With adequate evacuation, a high vacuum of $10^{-6}$ Torr or lower pressure can be attained within the electron optical means. Such a vacuum enables the microscope to employ a plurality of different electron source types. More preferably, the electron optical means includes one or more of a thermionic tungsten wire electron emitter, a thermionic lantanum hexaboride electron emitter and a thermal field emitter for generating the electron beam for use in generating the probe.

DESCRIPTION OF THE DRAWINGS

Embodiments of the invention will now be described, by way of example only, with reference to the following diagrams in which.

DETAILED DESCRIPTION OF EMBODIMENTS OF THE INVENTION

Conventional SEMs suffer a problem that their samples must be maintained at a high vacuum in the order of $10^{-6}$ Torr pressure or lower. If higher operating pressures are employed, for example $10^{-4}$ Torr, electrical breakdown in their electron guns can occur and electron beam scattering by air molecules along their electron optical columns results in significant broadening of probes generated at their samples. Moreover, reduced operating lifetime of electron emitters employed in their guns arises as trace oxygen in their columns reacts with the emitters.

Moreover, samples in conventional SEMs require special preparation prior to viewing. Moisture has to be removed from the samples and then a thin coating of conductive material applied thereto, for example a 100 Angstroms thick layer of sputtered aluminium, to prevent sample charging when subjected to electron irradiation. For certain hydrated samples, for example biological tissue samples, such preparation can mask features to be viewed and prevents on-going biological processes being observed in such conventional SEMs.

Environmental scanning electron microscopes (ESEMs) have therefore recently been developed, for example as described in U.S. Pat. No. 5,250,808 which is hereby incorporated by reference, which allow samples to be maintained at elevated pressures, for example at atmospheric pressure, whilst electron optical columns of the ESEMs are operated at high vacuum, for example at pressures in the order of $10^{-5}$ to $10^{-6}$ Torr. ESEMs are distinguished from conventional SEMs in that they include a series of differentially pumped diaphragms providing associated apertures in a region of their objective lenses, the apertures providing the only gaseous coupling between the chambers and columns of the ESEMs. In each such ESEM, the ESEM electron beam passes from the ESEM column through the diaphragm apertures to the ESEM chamber.

The inventors have appreciated that, although ESEMs provide the benefit that their samples can be maintained at elevated pressure when being viewed, ESEMs have certain drawbacks compared to conventional SEMs. For example, inclusion of the aforementioned series of differentially pumped diaphragms results in the objective lenses of ESEMs providing a reduced degree of demagnification because of longer working distances and thereby resulting in a larger diameter probes. Moreover, objective lens spherical aberration increases as objective lens working distances are increased which results in further probe blurring. The inventors have further appreciated that it is beneficial to design an SEM so that it is reconfigurable to function as both a high vacuum SEM and also as an ESEM. Moreover, the inventors have further appreciated that it is highly desirable to be able to switch between SEM and ESEM modes of operation progressively.

Figure 1:
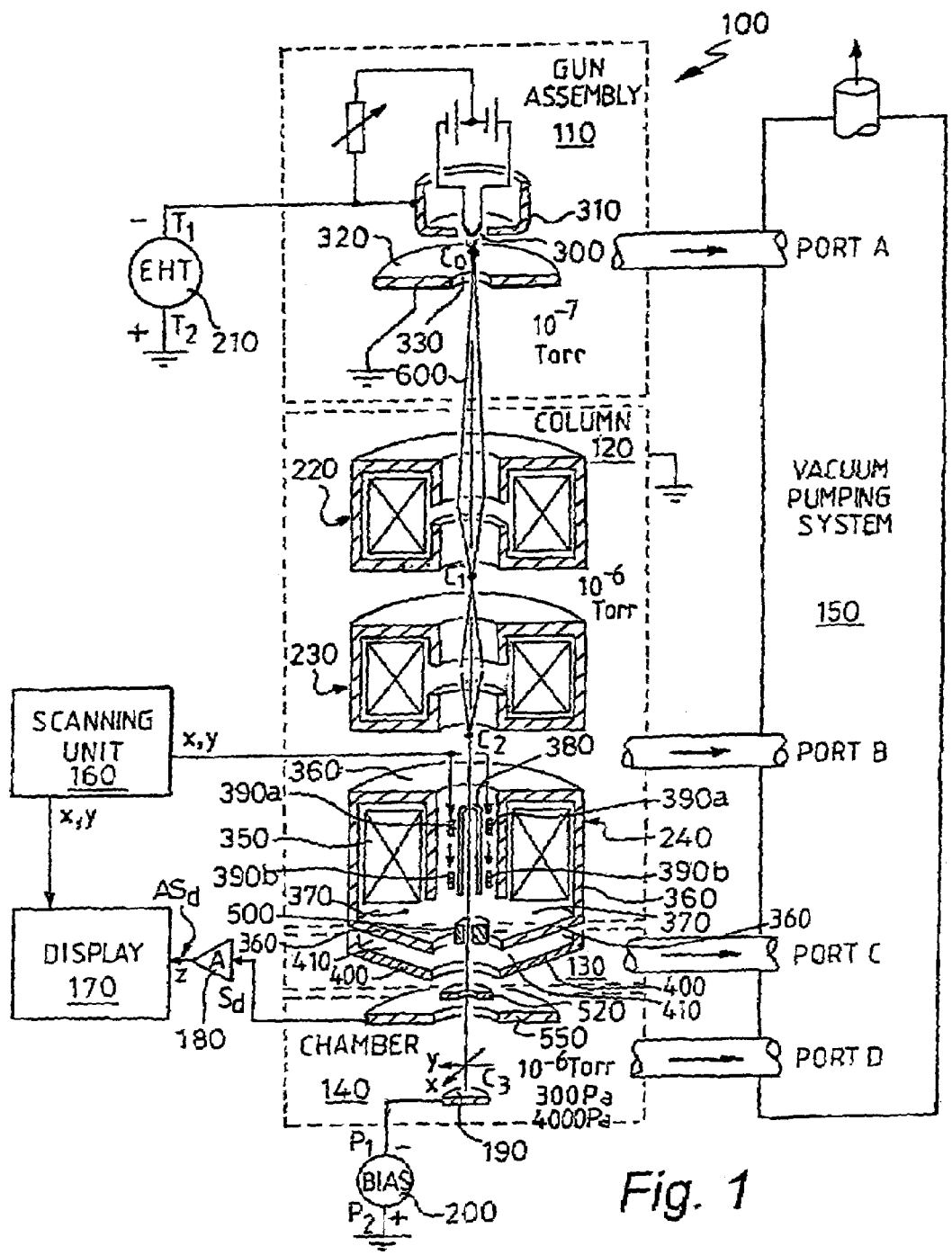
FIG. 1 is a schematic diagram of a reconfigurable SEM according to the invention, the reconfigurable SEM including an objective lens comprising removable aperture members.

Referring now to FIG. 1, a reconfigurable scanning electron microscope (RSEM) according to the present invention is indicated generally by 100. The RSEM 100 comprises an electron gun assembly 110, an electron optical column 120, a differential pumping region 130 bounded by one or more removable diaphragms each providing an associated aperture, a sample chamber 140 and a vacuum pumping system 150. The RSEM 100 further comprises a scanning unit 160 and an image display 170 with an associated signal amplifier 180. The chamber 140 includes a sample 190 mounted on an electrically isolated stage (not shown). The RSEM 100 further comprises a bias generator 200 for applying a bias potential to the sample 190, and an extra high tension (EHT) voltage supply 210 for applying a bias potential to the gun assembly 110.

The column 120 comprises an upper electromagnetic demagnifying lens 220, a lower electromagnetic demagnifying lens 230 and finally an electromagnetic objective lens 240 remote from the gun assembly 110 and near the chamber 140. The demagnifying lenses 220, 230 are of conventional design, each lens comprising an electromagnet bobbin winding and a mild steel or soft iron magnetic circuit. At a substantially central region of each of the lenses 220, 230, a gap in the magnetic circuit is provided across which an electron beam focusing magnetic field can be established by passing current through the bobbin winding.

Interconnection of parts within the RSEM 100 will now be described.

The gun assembly 110, the column 120, the differential region 130 and the chamber 140 are mounted in sequence together as a vertically orientated stack as shown having the gun assembly 110 at the top of the stack and the chamber 140 at the bottom of the stack. The gun assembly 110 and the column 120 are coupled for evacuation purposes and are connected through ports A and B respectively to the pumping system 150. The gun assembly 110 is electrically connected at its cathode to a negative output terminal $T_1$ of the EHT supply 210. A positive output terminal $T_2$ of the supply 210 is connected to a ground potential of the RSEM 100. The EHT supply 210 is designed to provide an output potential which can be varied in a range from 500 volts to 30 kV.

The gun assembly 110 conveniently employs a tungsten wire electron emitter 300. However, the assembly 110 can alternatively employ a resistively heated or electron-bombardment heated lanthanum hexaboride ($LaB_6$) crystal electron emitter instead of the tungsten wire emitter 300. The assembly 110 also includes a Wehnelt electrode 310 for use in controlling electron emission from the assembly 110. Moreover, the assembly 110 further comprises an anode electrode 320 at substantially ground potential, the anode electrode 320 including a central hole 330 through which an electron beam 600 emitted from the emitter 300 propagates to the column 120. In operation, the electron beam 600 is focused by the anode and Wehnelt electrodes 320, 310 respectively to a crossover $C_0$ a short distance below the emitter 300, the short distance being in the order of 3 to 20 mm.

The vacuum port A is connected directly to the gun assembly 110 to ensure that a high vacuum in the order of $10^{-6}$ Torr or better is established thereat during operation. Such a high vacuum is desirable to circumvent a risk of electrical breakdown between the aforementioned Wehnelt and anode electrodes 310, 320 and also to provide the emitter 300 with an extended working life span.

The objective lens 240 comprises a magnet bobbin winding 350 and a magnetic circuit 360 operable to generate an electron beam focusing magnetic field in a gap region 370 of the lens 240. The magnetic circuit 360 is preferably fabricated from mild steel or soft iron. In a central bore of the lens 240, there is mounted a liner tube 380 surrounded by two sets of pre-lens deflectors 390a, 390b capable of deflecting the beam along x and y axes at the sample 190 as illustrated in FIG. 1. The deflectors 390a, 390b are connected to the scanning unit 160, the scanning unit 160 being also connected to the display 170.

Figure 5:
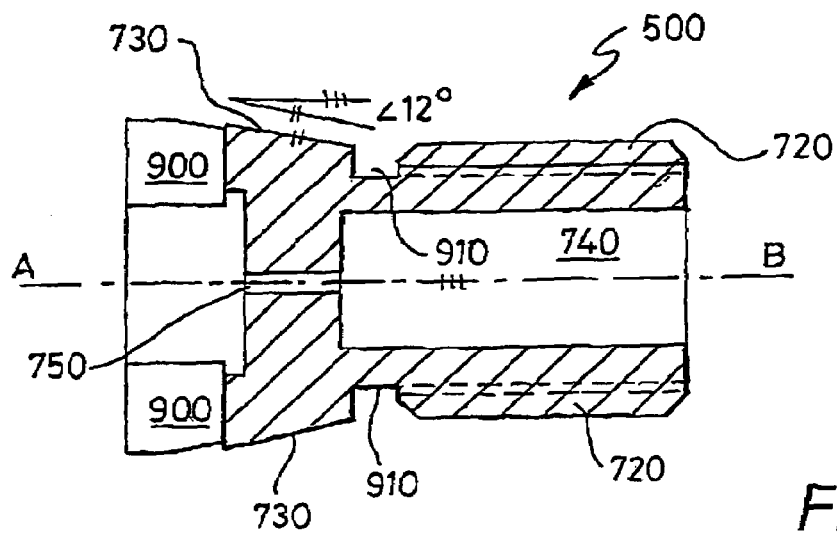
FIG. 5 is a cross-sectional diagram of an upper aperture member of the objective lens.

The lens 240 further comprises a lower plate 400 of non-ferrous material, for example duraloy or aluminium, which is an integral part of the objective lens 240. The lower plate 400 is attached to an underside part of the magnetic circuit 360 as illustrated in FIG. 5. The lower plate 400 and the underside part of the circuit 360 define an intermediate pressure cavity 410 which is coupled to port C of the vacuum pumping system 150 for evacuation purposes.

The column 120 is gaseously coupled to the cavity 410 solely through a first aperture in an upper aperture bearing member 500. As will be elucidated later, the upper aperture member 500 can be removed by an operator for certain modes of RSEM 100 operation.

Likewise, the cavity 410 is gaseously coupled to the chamber 140 solely through a second aperture in a lower aperture bearing member 520. The lower aperture member 520 can also be removed by the operator for certain modes of RSEM 100 operation.

An electron detector 550 is mounted beneath the lower plate 400. A signal output from the detector 550 is connected to an input of the amplifier 280 whose output is coupled to an intensity modulation input of the display 170. The sample 190 is electrically connected to a negative output terminal $P_1$ of the bias generator 200, a corresponding positive output terminal $P_2$ of the bias generator 200 being connected to the ground potential of the RSEM 100. The chamber 140 is coupled to port D of the vacuum pumping system 150 for at least partially evacuating the chamber 140. The bias generator 200 is operable to generate an electric field between the sample 190 and the detector 550 for accelerating electrons released from the sample 190 during scanned electron probe irradiation towards the detector 550.

Operation of the RSEM 100 will now be described where the RSEM 100 includes the upper and lower aperture members 500, 520 respectively.

The operator of the RSEM 100 vents the chamber 140 to atmospheric pressure, opens an access door of the chamber 140 and places the sample 190 on an insulated adjustable stage of the RSEM 100, the operator ensuring that the sample 190 is electrically connected to the terminal $P_1$ of the bias generator 200. The operator than closes the access door and sets the pumping system 150 to pump the chamber 140 to a pressure of substantially 4000 Pa or lower. The pumping system 150 also evacuates the cavity 410 to a pressure in a range of 1 to 400 Pa, an interior region of the column 120 to a pressure in the order of $10^{-5}$ to $10^{-6}$ Torr and an interior region of the gun assembly 110 to a pressure in a range of $10^{-6}$ to $10^{-7}$ Torr.

The operator then energises the EHT supply 210 to apply an EHT potential to the emitter 300. Next, the operator applies heating to the emitter 300 for emitting thermionic electrons therefrom which are focused by au electrostatic field established between the Wehnelt electrode 310 and the anode electrode 320 to form an electron beam 600 focused to a crossover $C_0$. The operator then energises the upper lens 220 with magnetising current to establish a magnetic field for focussing the electron beam 600 propagating therethrough to form a first demagnified crossover image $C_1$. Likewise, the operator energises the lower lens 230 with magnetising current to establish a magnetic field for focussing the electron beam 600 propagating therethrough to form a second demagnified crossover image $C_2$. The operator also energises the objective lens 240 with magnetising current for establishing a focusing magnetic field in the gap region 370. The electron beam 600 propagates from the second image $C_2$ through the liner tube 380 past the first set of deflectors 390a which tilts the beam 600 and then further down the liner tube 380 to the second set of deflectors 390b which further tilts the beam 600; the first and second deflectors 390a, 390b in combination are therefore capable of tilting and laterally displacing the beam 600 as it passes through a central region of the tube 380. The beam 600 then propagates past a lower end of the tube 380 through a focussing magnetic field region of the lens 240 and thereafter to the aperture of the upper aperture member 500 through which is passes. The beam 600 continues to propagate to the aperture of the lower aperture member 520 and passes therethrough to enter the chamber 140 and finally to provide a finely focused electron probe at the sample 190. The probe excites the generation of backscattered and secondary electrons at the sample 190 which are repelled by the bias potential provided by the bias generator 200 to impact onto the detector 550 and give rise to a signal $S_d$. The signal $S_d$ passes to the amplifier 180 whereat it is amplified to generate a corresponding amplified signal $AS_d$. The amplified signal $AS_d$ is coupled to an intensity modulating input of the display 170. As the display 170 is synchronised for scanning purposes to the scanning unit 160 which, in turn, drives the deflectors 190a, 190b, a magnified image of the sample 190 is formed on the display 190 for viewing by the operator.

For flexibility and for enabling the RSEM 100 to provide the best characteristics of a high-vacuum SEM and an ESEM, the inventors have appreciated that it is highly advantageous to make the upper and lower aperture members 500, 520 selectively removable. Thus, in a first mode of operation, both the upper and lower aperture members 500, 520 are installed enabling the chamber 140 to be operated at pressures of up to 4000 Pa; both the upper and lower aperture members 500, 520 function as pressure transitions within the RSEM 100. In a second mode of operation, only the upper aperture member 500 is installed enabling the chamber 140 to be operated at pressures of up to 300 Pa; the upper aperture member 500 functions as a pressure transition within the RSEM 100. In a third mode of operation, both the upper and lower aperture members 500, 520 are removed enabling the RSEM 100 to be operated as a conventional SEM where the chamber 140 is at a nominal high-vacuum pressure in the order of $10^{-6}$ Torr. A fourth mode of operation is feasible where only the lower aperture member 520 is installed although the inventors do not envisage this mode being employed frequently.

When the lower aperture member 520 is removed, the objective lens 240 is capable of operating with a shorter working distance which results in reduced objective lens spherical aberration and hence a smaller probe for scanning the sample 190. Such a shorter working distance requires the objective lens 240 to be energised with more magnetising current compared to operation of the RSEM 100 with both aperture members 500, 520 installed.

The inventors have designed the upper aperture member 500 to provide the RSEM 100 with an aperture preferably of substantially 200 μm diameter, although an aperture having a diameter in a range of 100 to 400 μm can beneficially be employed. Likewise, the inventors have designed the lower aperture member 520 to provide the RSEM 100 with an aperture preferably of 500 μm diameter, although an aperture having a diameter in a range of 200 μm to 800 μm can beneficially be employed.

By modifying the diameters of the apertures in the upper and lower members 500, 520 respectively, it will be appreciated that the pressure at which the chamber 140 can be operated can be modified. Moreover, the inventors have designed lens current controllers (not shown) providing magnetising current to the lenses 220, 230, 240 to be operator variable so that the objective lens 240 can be operated with a shorter working distance when the lower aperture member 520 is not installed thereby enabling the objective lens 240 to form an electron probe having reduced spherical aberration, the aperture in the upper aperture member 500 providing an electron beam semiangle limiting constraint for the column 120.

It will further be appreciated that the sample 190 can, if required, be mounted on a cryogenically cooled surface when viewed thereby reducing the vapour pressure of any fluid components of the sample 190. In this respect, an electro-thermal element operating according to the Seebeck effect is advantageously mounted in the chamber 140 for supporting the sample 190 and cooling it.

The liner tube 380 is preferably manufactured from a dielectric material, for example a fibre reinforced resinous polymer, and lined on its inside surface with thin conducting foil or a sputtered metallic layer to reduce eddy current induction when the deflectors 390a, 390b are driven with high frequency scanning signals, for example scanning signals having harmonic components up to several hundred kHz.

The detector 550 can be one or more of a microchannel plate, a simple rear-insulated conductor plate, a shallow planar diode structure or a scintillator structure fibre-optically coupled to a photomultiplier tube.

It will be appreciated from the foregoing that the upper and lower aperture members 500, 520 are significant features of the RSEM 100. These members 500, 520 will now be elucidated in more detail with reference to FIG. 2.

Figure 2:
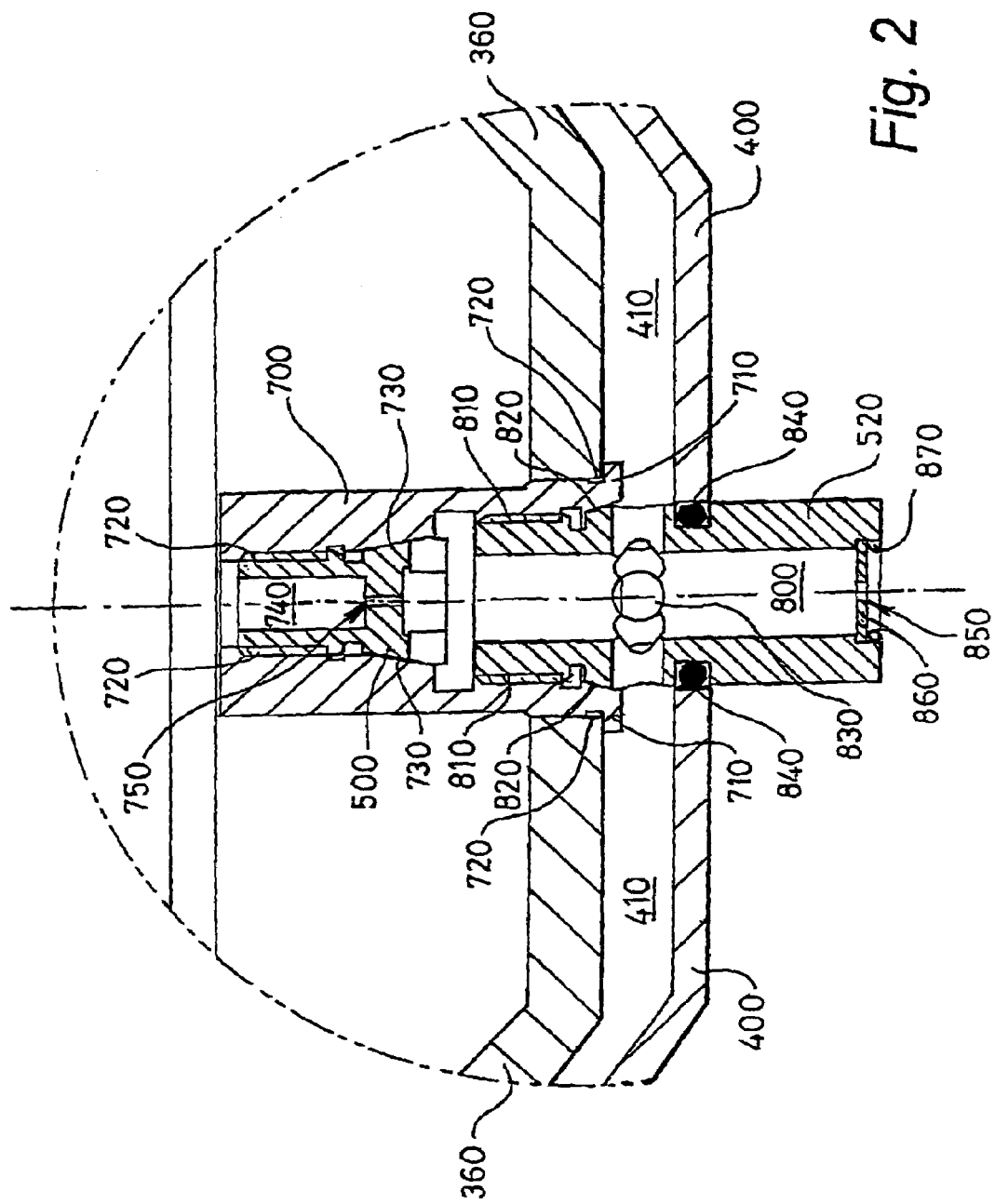
FIG. 2 is an enlarged cross-sectional view of the removable members of the objective lens illustrated in FIG. 1.

In FIG. 2, a part of the objective lens 240 is illustrated in greater detail in side cross-sectional view. There is shown the upper aperture member 500, the lower aperture member 520, the magnetic circuit 360, the lower plate 400 and a carrier member 700. The aperture members 500, 520 and the carrier member 700 are of a generally cylindrical form.

The magnetic circuit 360 comprises a central bore which has honed and lapped inside-facing surfaces where the bore interfaces onto the carrier member 700. The bore is manufactured to a high degree of circularity in order to reduce astigmatism of the objective lens 240 to a low degree. The carrier member 700 is held by a cold fit into the bore; in other words, the carrier member 700 is machined to have a bore-engaging outside diameter which is a few microns greater then the inside diameter of the bore. When assembling the carrier member 700 into the bore, the carrier member 700 is inserted in a cooled contracted state into the bore which is in a heated expanded state. The carrier member 700 and the bore are then allowed to achieve a mutually similar temperature whereat the carrier member 700 is firmly retained within the bore. The carrier member 700 is thus designed to be a permanent part of the objective lens 240 and not operator-detachable therefrom.

The carrier member 700 is preferably fabricated from beryllium copper alloy, whereas the upper and lower aperture members are preferably manufactured from phosphor bronze alloy. The inventors have appreciated that other materials can be employed, for example non-magnetic materials having a relative permeability of substantially unity such as non-magnetic stainless steel. Preferably, the members 500, 520 are manufactured from a material which is dissimilar to that of the carrier member 700 to circumvent a risk of the aperture members 500, 520 vacuum welding to the carrier member 700.

The carrier member 700 incorporates an annular flange 710 to ensure that it is precisely engaged onto the magnetic circuit 360 when cold-fitted into the lens 240 during manufacture. An annular recess 720 is machined into an exterior surface of the carrier member 700 to clear a precisely-formed inside bottom edge of the central bore of the circuit 360.

Figure 3:
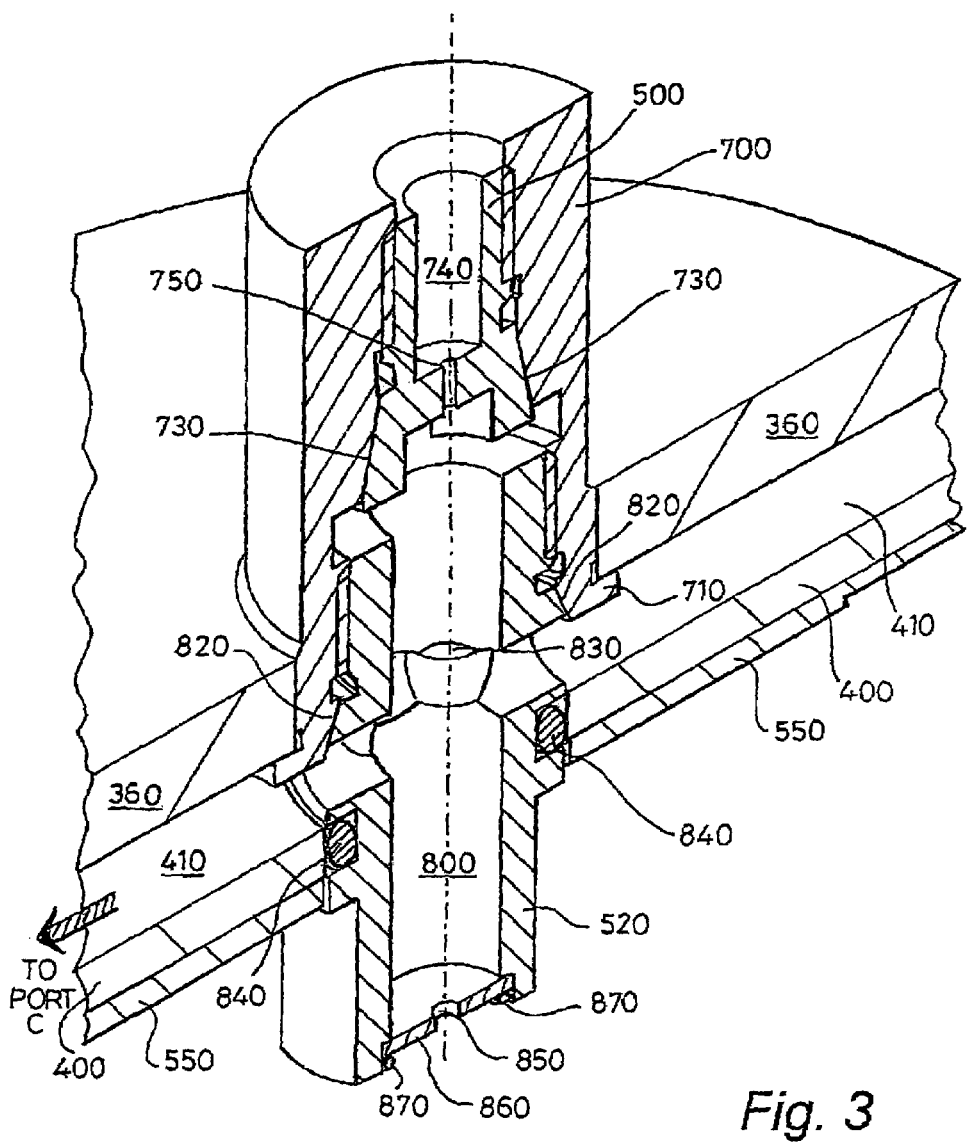
FIG. 3 is an orthogonal partially sectioned view of the removable members illustrated in FIG. 2.

The upper aperture member 500 is removably retained within the carrier member 700 by way of co-operating screw threads 720 machined into an upper inside surface of the carrier member 700 and into an upper exterior surface of the upper aperture member 500 as illustrated in FIG. 3. Moreover, the carrier member 700 and the upper aperture member 500 include co-operating frusto-conical surfaces 730 lower down from the threads 720, these surfaces 730 predominantly governing lateral alignment of the upper member 500 within the carrier member 700 and hence within the objective lens bore. In the region of the threads 720, the upper member has an internal bore 740 of substantially 1.5 mm diameter, and preferably within a range of 1.45 to 1.55 mm in diameter. In the region of the frusto-conical surfaces 730, the upper aperture member 500 includes a fine bore hole 750 providing the first aperture of the objective lens 240. The fine hole 750 preferably has a diameter of substantially 200 µm, namely within a range of 150 to 250 µm. Moreover, the fine hole 750 has a depth of substantially 1 mm, namely preferably within a range of 1.5 mm to 0.5 mm. The hole 750 can be produced by one or more of spark erosion, ion milling, laser ablation, chemically assisted photo-etching and mechanical drilling using a fine drill bit. A slot is machined into a lower end of the carrier member 500 remote from the thread 720 for engaging with a screw-driver like tool supplied with the RSEM 100 to enable the operator to remove the upper member 500 from the carrier member 700 by way of the chamber 140 providing access.

The fine hole 750 is made relatively long to provide a substantial flow resistance to gas present in the chamber 140 when operating at pressures approaching 4000 Pa when the lower aperture member 520 is installed, and at pressures approaching 300 Pa when the lower aperture member 520 has been removed.

The lower aperture member 520 includes a central bore 800 of substantially 2.5 mm diameter, namely a diameter within a range of 2.2 mm to 2.7 mm. The lower member 520 includes a screw thread 810 on its upper outer surface for co-operating with corresponding threads machined on an inside facing surface of the carrier member 700. lower down from the threads 810, the lower member 520 comprises a frusto-conical surface 820 for co-operatively engaging onto a corresponding surface machined into the carrier member 700. These surfaces 820 serve to accurately define the lateral and vertical position of the second aperture within the objective lens 240. Yet lower down the lower member 520, eight angularly equi-spaced holes, for example a hole 830 of substantially 1 mm diameter, namely within a range of 0.8 mm to 1.1 mm diameter, are machined laterally into the member 520. The holes 830 are arranged to align with the cavity 410 when the lower member 520 is installed into the carrier member 700. Yet lower down the lower member 520, a recess is machined for accommodating a Viton "O"-ring 840 which is designed to provide a vacuum seal between the lower member 520 and the lower plate 400, thereby rendering gaseous coupling from the chamber 140 to the cavity 410 possible only via the second aperture indicated by 850 when the lower member 520 is installed into the carrier member 700. At a bottom end of the lower member 520 remote from the threads 810, the bore 800 widens out to provide an abutting edge for a platinum or molybdenum diaphragm 860 into which the aperture 850 is formed, the diaphragm 860 being maintained in position by way of a circlip 870. Two flats are machined into the exterior surface of the lower member 520 for engaging with a spanner-type tool for enabling the operator to remove or install the lower member 520 into the carrier member 700. Preferably, the spanner-type tool includes a ratchet to prevent the operator from tightening the lower member 520 excessively and potentially shearing the member 520 in the vicinity of the holes 830.

Figure 4:
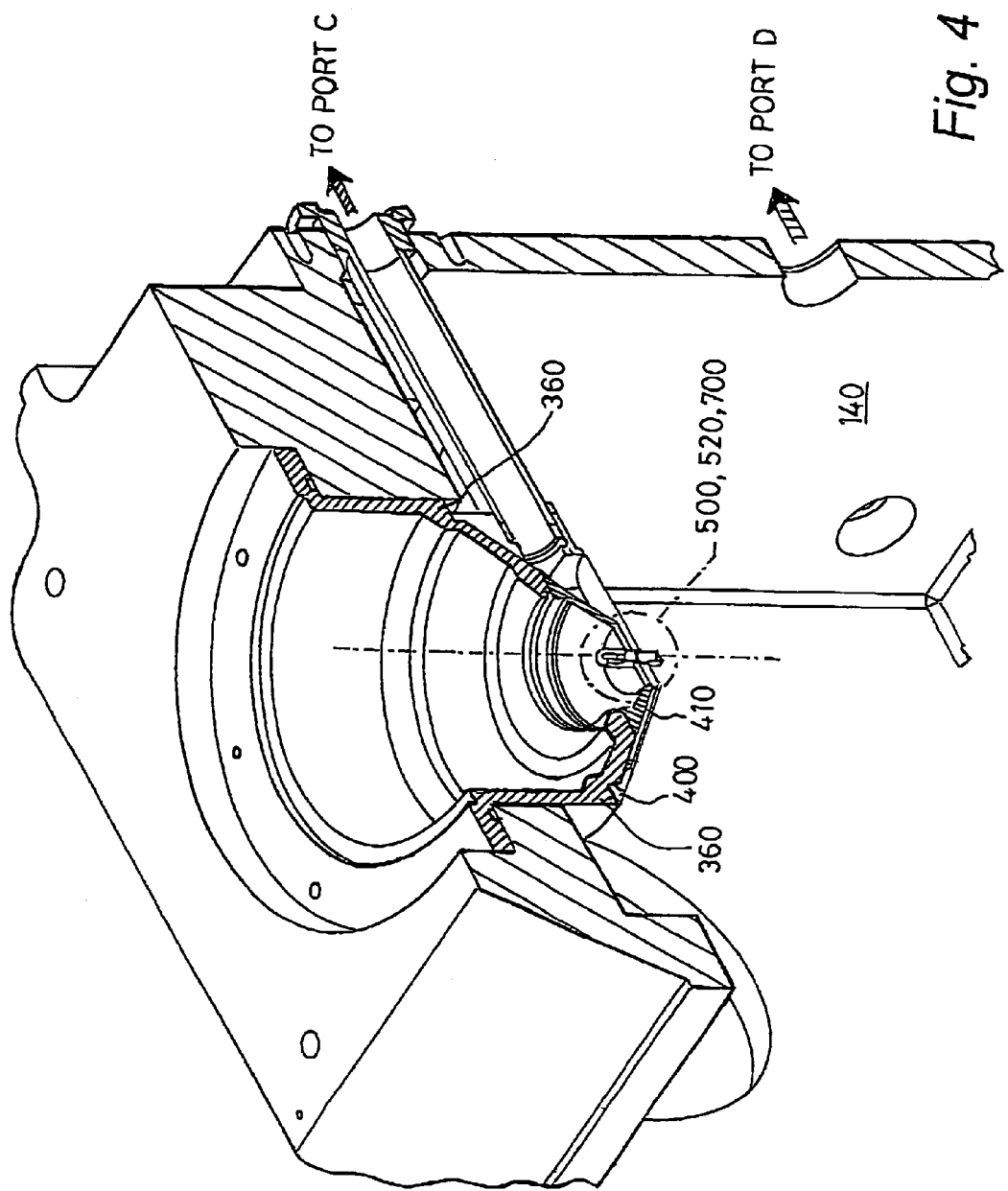
FIG. 4 is an orthogonal partially sectioned diagram of a lower magnetic pole piece of the objective lens with the removable members installed.

Referring to FIG. 3, there is shown an orthogonal cross-sectional view of the carrier member 700 and the aperture members 500, 520 mounted into the objective lens 240. The detector 550 is shown attached to an underside surface of the lower plate 400. In FIG. 4 there is shown in orthogonal cross-sectional view a lower pole piece of the magnetic circuit 360 installed onto the chamber 140 with the lower plate 400 mounted onto the pole piece. Moreover, the carrier member 700 and its aperture members 500, 520 are shown installed in position. It will be appreciated from FIG. 4 that the carrier member 700 and the aperture members 500, 520 are relatively small in comparison to the size of the RSEM 100 although their function is important to the overall performance of the RSEM 100.

Referring now to FIG. 5, the upper member 500 is shown on cross-sectional view. The member 500 comprises the slot denoted by 900 for engaging with the aforementioned screwdriver-type tool. The frusto-conical surface 730 is machined to an angle of substantially 12° with respect to a central axis of symmetry A-B, namely within a range of 10° to 15°. A recess 910 is also machined into the member 500 as it is not practicable to machine the thread 720 exactly up to where the frustro-conical surface starts. It is to be appreciated that accurate concentric alignment of the hole 750 to the frusto-conical surface is preferable and can be achieved during manufacture without needing to disengage the upper member 500 from a holding chuck whilst forming these features as both the hole 750 and the surface 730 are substantially at one end of the member 500. As elucidated in the foregoing, the upper member 500 is preferably fabricated from phosphor bronze alloy as this material machines well, is mechanically stable and strong, and is non-ferromagnetic. Moreover, it is relatively non-porous compared to aluminium, such porosity being a consideration when operating the RSEM 100 in high-vacuum mode with its chamber 140, gun 110 and column 120 at substantially $10^{-7}$ Torr.

Figure 6:
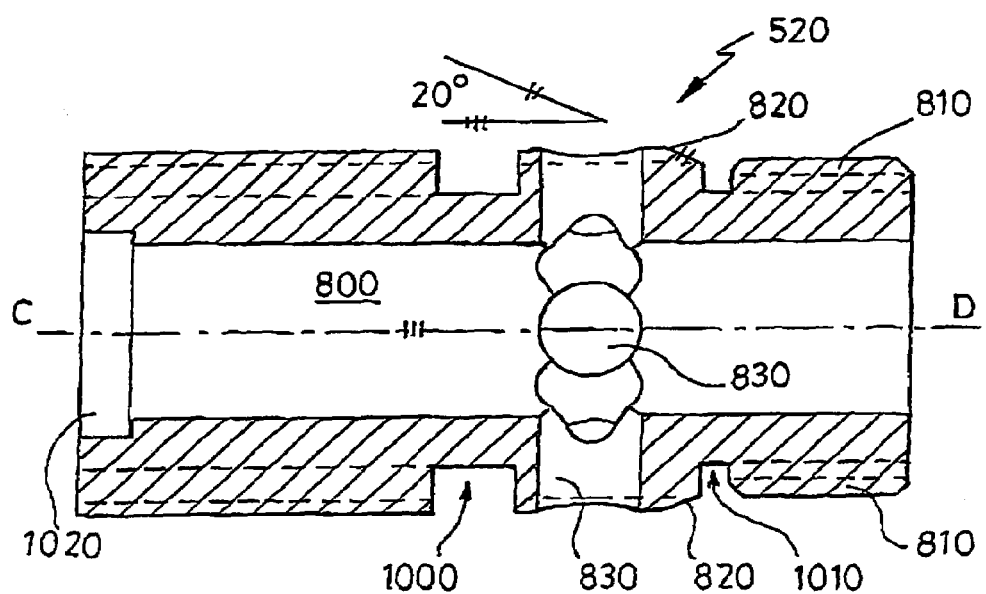
FIG. 6 is a cross-sectional diagram of a lower aperture member of the objective lens.

Referring next to FIG. 6, the lower member 520 is shown in cross-sectional view, with the diaphragm 860 and circlip 870 omitted. The member 520 includes a recess 1000 for accommodating the "O"-ring 840, and a recess 1001 for holding the diaphragm 860 and its associated circlip 870. A recess 1010 separates the thread 810 from the frusto-conical surface 820. The frusto-conical surface 820 subtends an angle of substantially 20° relative to an axis of symmetry C-D of the member 520, namely an angle in a range of 15° to 30°. As elucidated in the foregoing, the lower member 520 is fabricated from phosphor bronze alloy.

Figure 7:
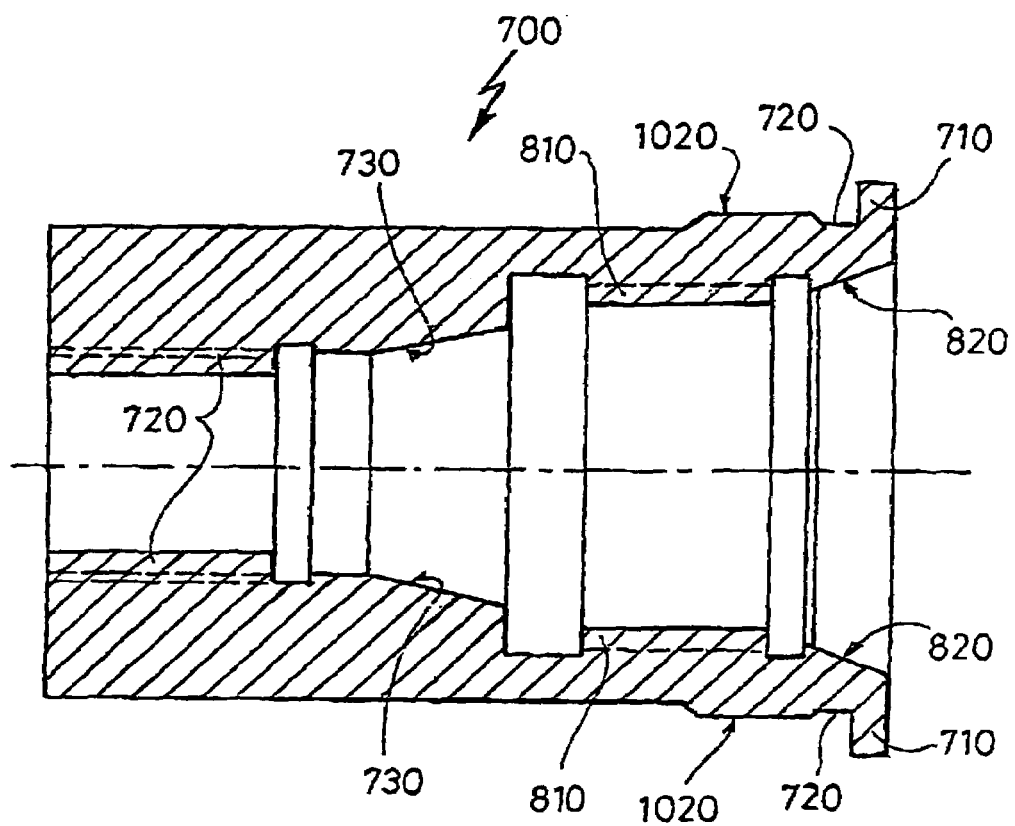
FIG. 7 is a cross-sectional diagram of a carrier member for retaining the upper and lower members within the objective lens.

Referring finally to FIG. 7, the carrier member 700 is shown in cross-sectional view. It will be appreciated that all critical surfaces of the carrier member 700, namely the frusto-conical surfaces 730, 820 and an exterior surface 1020 for interfacing to the bore of the magnetic circuit 360 of the objective lens 240 can all be machined without needing to remove the carrier member 700 from a holding chuck, thereby assisting to ensure accurate concentricity of these surfaces 730, 820, 1020. By such machining techniques, the first and second apertures of the upper and lower members 500, 520 are accurately concentric to the bore of the objective lens 240 which is important to avoid probe aberrations, for example astigmatism.

It will be appreciated that changes and modifications can be made to the RSEM 100 without departing from the scope of the invention.

Although the RSEM 100 is described in the foregoing as including up to two individually removable aperture members 500, 520, the inventors have appreciated that the carrier member 700 can be modified to include more than two aperture members, for example three individually removable aperture members each including an associated aperture.

Likewise, forming the hole 750 in the upper aperture member 500 is an exacting machining task. The inventors have appreciated that the hole 750 can alternatively be implemented by employing a stack of diaphragms having mutually aligning central apertures.

When more than two aperture members are employed, the inventors have appreciated that the RSEM 100 can be provided with more than one differentially pumped region 130 thereby enabling the chamber 140 to be operated at pressures in excess of 4000 Pa when viewing samples by electron probe irradiation.

Although the gun assembly 110 is described in the foregoing as employing a heated tungsten wire or lanthanum hexaboride crystal emitter 300, the inventors have appreciated that the gun assembly 110 can alternatively employ a thermionic field emitter, although it is envisaged that provision of an additional ion pump would be required at pumping port A to ensure that an adequate vacuum is achieved in operation at the gun assembly 110.

Moreover, in order to provide benefits of shorter objective lens working distance, and hence reduced spherical aberration, the inventors have appreciated that the carrier member 700 and its associated aperture members 500, 520 can be mounted further up the objective lens 240. However, such a modification results in reduced accessibility to the aperture members 500, 520 from the chamber 140, and eddy-current induction in the carrier member 700 from the pre-lens deflectors 390a, 390b would render this modification superficially unattractive.

Machining the carrier member 700 and the aperture members 500, 520 is an exacting machining operation as tolerances have to be maintained within microns at abutting faces, or example at the frusto-conical surfaces 730, 820. The inventors have appreciated that moulding and casting techniques could be employed to reduce manufacturing costs, for example by employing conductive polymers mouldings for the members 500, 520.

The invention claimed is:

1. A reconfigurable scanning electron microscope comprising:
    an electron optical column and a sample chamber,
    said electron optical column comprising:
    an electron gun assembly,
    an electron optical system defining an optical axis and comprising a lens system which forms an electron probe from electrons emitted by said electron gun and a deflector which scans said electron probe across a sample,
    said lens systems comprising an objective lens comprising a gun side pole piece and a sample side pole piece, a carrier member which is arranged within a bore in said sample side pole piece, a first aperture bearing member and a second aperture bearing member, said first and second aperture bearing members being removably arranged within or at said carrier member so that said electron optical system can be operated with none, one or two aperture bearing members arranged in or at said carrier member, whereby said first aperture member is, in use, arranged within or at said carrier member so that its aperture is positioned on the optical axis and between the electron gun and said sample side pole piece, and said electron microscope further including a detector which is sensitive to emissions from a sample in response to scanned electron probe irradiation thereof.

2. A microscope according to claim 1, in which the microscope includes an intermediate pressure cavity between the electron optical column and a chamber accommodating the sample, the chamber being in gaseous communication via the carrier member to the electron optical column.

3. A microscope according to claim 2, wherein the objective lens includes a lower plate for defining the intermediate cavity between a lower pole piece of the objective lens and the lower plate.

4. A microscope according to claim 3, in which the aperture bearing members comprises first and second aperture bearing members, the first member including a first aperture serving to substantially gaseously isolate the electron optical means from the intermediate pressure cavity and the second member including a second aperture serving to substantially gaseously isolate the chamber from the intermediate pressure cavity.

5. A microscope according to claim 2, including a vacuum pump for differentially evacuating the electron optical column, the intermediate pressure cavity and the chamber.

6. A microscope according to claim 4, wherein the carrier member and the aperture bearing members are fabricated from substantially non-ferromagnetic materials.

7. A microscope according to claim 4, wherein the carrier member is fabricated from a material dissimilar to that of the aperture bearing members.

8. A microscope according to claim 7, wherein the materials of the carrier member and the aperture members are sufficiently different to avoid in use vacuum welding of one or more of the aperture members to the carrier member.

9. A microscope according to claim 6, wherein the carrier member is fabricated from beryllium copper alloy and the aperture bearing members are fabricated from phosphor bronze alloy.

10. A microscope according to claim 4, wherein the aperture members are removably retained within the carrier member by means of co-operating screw threads.

11. A microscope according to claim 3, wherein the aperture bearing members include frusto-conical surfaces for registering to corresponding frusto-conical co-operating surfaces of the carrier member, thereby ensuring accurate spatial alignment of the aperture members to the objective lens.

12. A microscope according to claim 11, wherein the frusto-conical surface of the first aperture member subtends an angle in a range of 10° to 150° relative to a central longitudinal axis of the first member.

13. A microscope according to claim 11, wherein the frusto-conical surface of the first member subtends an angle of substantially 12° relative to the central axis of the first member.

14. A microscope according to claim 11, wherein the frusto-conical surface of the second aperture member subtends an angle in a range of 15° to 30° relative to a central longitudinal axis of the second member.

15. A microscope according to claim 11, wherein the frusto-conical surface of the second aperture member subtends an angle of substantially 20° relative to the central longitudinal axis of the second member.

16. A microscope according to claim 3, wherein the first member includes a first electron beam transmissive aperture having a diameter in a range of 100 μm to 400 μm.

17. A microscope according to claim 16, wherein the first aperture has a diameter of substantially 200 μm.

18. A microscope according to claim 3, wherein the first aperture has a depth in a range of 0.5 mm to 1.5 mm.

19. A microscope according to claim 18, wherein the first aperture has a depth of substantially 1 mm.

20. A microscope according to claim 4, wherein the second aperture member includes a second electron beam transmissive aperture having a diameter in a range of 200 μm to 800 μm.

21. A microscope according to claim 20, wherein the second aperture has a diameter of substantially 500 μm.

22. A microscope according to claim 20, wherein a diaphragm including the second aperture is retained in position in the second aperture member by means of a clip.

23. A microscope according to claim 20, wherein the second aperture is provided in a diaphragm fabricated from at least one of platinum and molybdenum.

24. A microscope according claim 4, wherein the second aperture bearing member includes a plurality of radial holes for gaseously communicating an inside region of the second member with the intermediate pressure cavity.

25. A microscope according to claim 24, wherein the plurality of holes are angularly equi-spaced.

26. A microscope according to claim 24, wherein the plurality of holes comprises eight holes.

27. A microscope according to claim 24, wherein each of the plurality of holes has a diameter in a range of 0.8 mm to 1.1 mm.

28. A microscope according to claim 27, wherein each of the plurality of holes has a diameter of substantially 1 mm.

29. A microscope according to claim 1, wherein the carrier member is retained in the objective lens by means of cold fitting.

30. A microscope according to claim 4, wherein the first aperture member includes a slot feature for engaging with a tool when installing or removing the first member from the carrier member.

31. A microscope according to claim 4, wherein the second aperture member comprises a plurality of flats on its exterior surface for engaging with a tool when installing or removing the second member from the carrier member.

32. A microscope according to claim 3, wherein the detector is in the form of an annular detector attached to the lower plate and presenting a detecting surface orientated towards the sample.

33. A microscope according to claim 3, wherein the lower plate is fabricated from at least one of aluminium and duraloy.

34. A microscope according to claim 3, wherein the detector comprises at least one of an electron sensitive photodiode, a microchannel plate, a scintillator-photomultiplier tube combination and an electrically isolated conductor plate.

35. A microscope according to claim 1, wherein the electron optical column includes one or more of a thermionic tungsten wire electron emitter, a thermionic lanthanum hexaboride electron emitter and a thermal field emitter for generating the electron beam for use in generating the probe.

36. The scanning electron microscope of claim 1, wherein said carrier member comprises a frusto-conical surface aligned to said optical axis and a second frusto-conical surface aligned to said optical axis, said first aperture bearing member having a frusto-conical surface of said carrier member and said second aperture bearing members having a frusto-conical surface co-operating with said second frusto-conical surface of said carrier member, said first and second frusto-conical surfaces of said carrier member defining opening along said optical axis and said openings become wider in the direction from said electron gun to said sample.

37. A microscope according to claim 1, wherein the carrier member is permanently fixed to the objective lens.

38. A microscope according to claim 1, wherein the first aperture bearing member includes a non circularly symmetric lower formation for enabling a complementary tool to engage the member to enable the latter to be screwed into or out from the carrier member.

39. A microscope according to claim 1, wherein in a first configuration the carrier member accommodates no aperture bearing member in a second configuration the carrier member accommodates the first aperture bearing member only, and the carrier member accommodates both the first and second aperture bearing members in a third configuration of the microscope.

* * * * *